US011063099B2

(12) United States Patent
Son

(10) Patent No.: US 11,063,099 B2
(45) Date of Patent: Jul. 13, 2021

(54) ORGANIC LIGHT-EMITTING DISPLAY DEVICE

(71) Applicant: LG DISPLAY CO., LTD., Seoul (KR)

(72) Inventor: Hoonsok Son, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/701,736

(22) Filed: Dec. 3, 2019

(65) Prior Publication Data

US 2020/0185470 A1 Jun. 11, 2020

(30) Foreign Application Priority Data

Dec. 11, 2018 (KR) ........................ 10-2018-0159331

(51) Int. Cl.
*H01L 27/32* (2006.01)

(52) U.S. Cl.
CPC ...... *H01L 27/3246* (2013.01); *H01L 27/3213* (2013.01); *H01L 27/3248* (2013.01)

(58) Field of Classification Search
CPC ............. H01L 27/3246; H01L 27/3213; H01L 27/3248
See application file for complete search history.

(56) References Cited

U.S. PATENT DOCUMENTS

| 2005/0212420 A1* | 9/2005 | Sakakura | ............... H05B 33/04 |
| | | | 313/512 |
| 2012/0301987 A1* | 11/2012 | Pang | .................. H01L 27/3246 |
| | | | 438/34 |
| 2014/0139102 A1* | 5/2014 | Jeon | ...................... H01L 27/326 |
| | | | 313/504 |
| 2017/0317154 A1* | 11/2017 | Heo | .................... H01L 27/3262 |

FOREIGN PATENT DOCUMENTS

KR 10-2018-0013469 A 2/2018

* cited by examiner

*Primary Examiner* — Fernando L Toledo
*Assistant Examiner* — Neil R Prasad
(74) *Attorney, Agent, or Firm* — Birch, Stewart, Kolasch & Birch, LLP

(57) ABSTRACT

An organic light-emitting display device including a substrate on which a plurality of sub-pixels are arranged; a thin film transistor and a first electrode of an organic light-emitting diode connected to the thin film transistor, the thin film transistor and the organic light-emitting diode being disposed in each of the plurality of sub-pixels; a first bank layer disposed on the first electrode and exposing the first electrode; and a second bank layer disposed on the first bank layer and exposing the first bank layer and the first electrode. Further, the first bank layer includes first regions overlapping with via holes through which the thin film transistor is connected to the first electrode and second regions which are regions other than the first regions, and a thickness of the first regions is greater than a thickness of the second regions.

16 Claims, 14 Drawing Sheets

ORGANIC LIGHT-EMITTING DISPLAY DEVICE

CROSS-REFERENCE TO RELATED APPLICATIONS

This application claims the priority benefit of Korean Patent Application No. 10-2018-0159331 filed in the Republic of Korea on Dec. 11, 2018, which is incorporated herein by reference for all purposes as if fully set forth herein.

BACKGROUND OF THE INVENTION

Field of the Invention

The present invention relates to an organic light-emitting display device having a double bank structure.

Discussion of the Related Art

Recently, various display devices having reduced weights and volumes which overcome the disadvantages of a cathode ray tube have been developed. Such display devices include a liquid crystal display (LCD), a plasma display panel (PDP), a field emission display (FED), an organic light-emitting display device, and the like.

Organic light-emitting display devices include elements that spontaneously emit light and have the advantages of a high response speed, high emission efficiency, a high luminance and a wide viewing angle. In addition, elements can be formed on a flexible substrate such as plastic and thus a flexible display device can be realized. As an organic light-emitting display device having a large area and high resolution is required, a plurality of sub-pixels is included in a single panel. In addition, a mask is generally used to pattern light emitting layers of red (R), green (G) and blue (B) sub-pixels. To realize a display device having a large area, a fine metal mask (FMM) having a large area corresponding to a substrate having a large area is required. However, a mask is bent as the area thereof increases, causing occurrence of various failures such as non-deposition of an organic light emitting material which forms a light emitting layer at a desired position.

To solve the aforementioned problem of a deposition method using a mask, a solution process which is simple and is advantageous for a large area is attracting interest. The solution process can pattern a large-area light emitting layer through inkjet printing or nozzle printing without a mask and has a very high material use rate of 50% to 80% compared to evaporation having a material use rate of below 10%. In addition, the solution process provides a glass transition temperature higher than that of an evaporated thin film and thus achieves high thermal stability and morphology property.

SUMMARY OF THE INVENTION

However, when a light emitting layer is formed through the solution process, a thickness non-uniformity of the light emitting layer due to a thickness deviation in sub-pixels considerably deteriorates the display quality. Accordingly, the present invention provides an organic light-emitting display device having a double bank structure.

An organic light-emitting display device according to an embodiment of the present invention includes: a substrate on which a plurality of sub-pixels are arranged; at least one thin film transistor and a first electrode of an organic light-emitting diode connected to the thin film transistor, the thin film transistor and the organic light-emitting diode being disposed in each of the plurality of sub-pixels; a first bank layer is disposed on the first electrode and exposing the first electrode; and a second bank layer disposed on the first bank layer and exposing the first bank layer and the first electrode, wherein the first bank layer includes first regions overlapping with via holes through which the thin film transistor is connected to the first electrode and second regions which are regions other than the first regions, and the thickness of the first regions may be greater than the thickness of the second regions.

The second bank layer may be disposed between sub-pixels emitting lights having different colors among the plurality of sub-pixels. The first regions may be disposed between sub-pixels emitting the same color light among the plurality of sub-pixels. The first regions and the second regions may not overlap. The second regions may overlap with the second bank layer.

The first regions may extend in parallel with a direction in which shorter sides of the plurality of sub-pixels extend. The first regions may overlap with the second bank layer while intersecting the second bank layer. The second regions may be separated having the first region interposed therebetween. The second regions may extend in parallel with a direction in which longer sides of the plurality of sub-pixels extend.

The second regions may overlap with the second bank layer while being disposed in parallel with the second bank layer and are continuously disposed. The second regions may be disposed between sub-pixels emitting the same color and between sub-pixels emitting different colors among the plurality of sub-pixels.

The first regions may be separated having the second region interposed therebetween. The first regions may not overlap with the second bank layer. The via holes may include a first via hole of a passivation layer which exposes one of source and drain electrodes of the thin film transistor, and a second via hole of an overcoat layer which is disposed on the passivation layer and exposes the first via hole. The first bank layer may have hydrophilicity and the second bank layer may have hydrophobicity.

Further, an organic light-emitting display device according to an embodiment of the present invention includes: a substrate on which a plurality of sub-pixels are arranged; a first electrode of an organic light-emitting diode disposed in each of the plurality of sub-pixels; a first bank layer is disposed on the first electrode and exposing the first electrode; and a second bank layer disposed on the first bank layer and exposing the first bank layer and the first electrode, wherein the first bank layer includes first regions disposed between sub-pixels emitting the same color light among the plurality of sub-pixels and second regions that are regions other than the first regions, and the thickness of the first regions may be greater than the thickness of the second regions.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DESCRIPTION OF EXEMPLARY EMBODIMENTS

Figure 1:
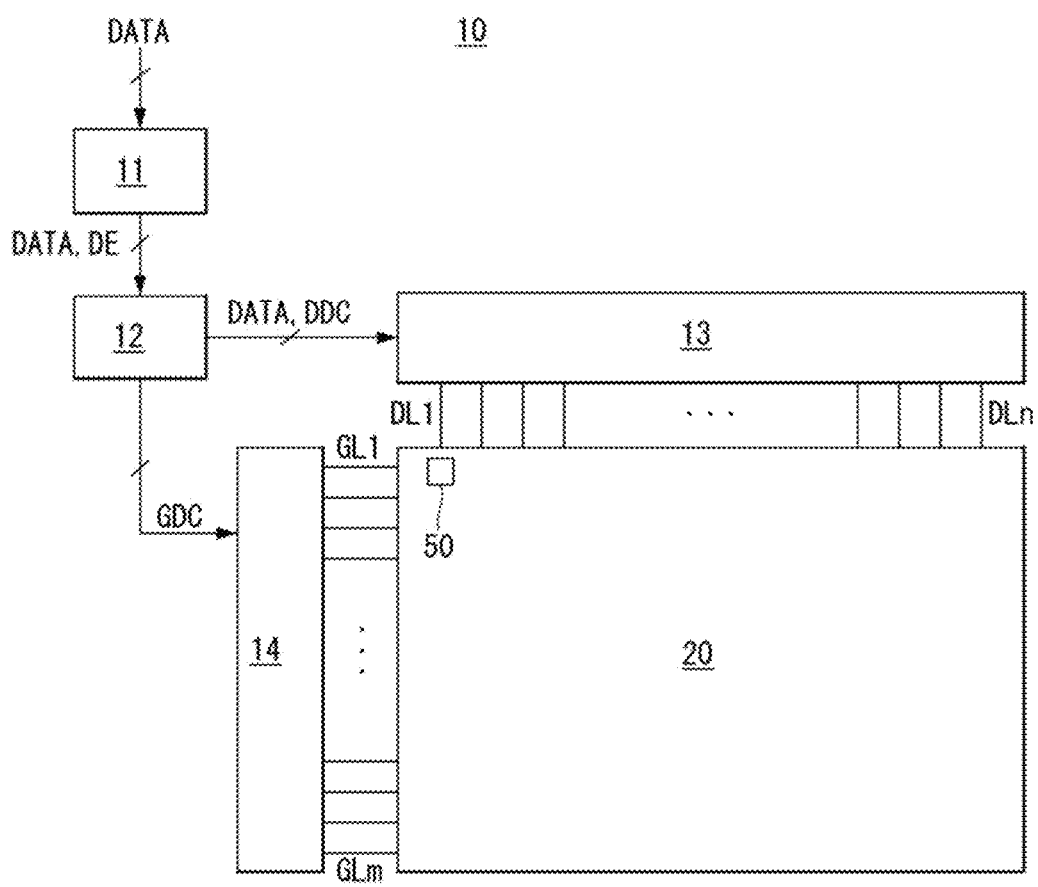
FIG. 1 is a schematic block diagram of an organic light-emitting display device.

The advantages, features and methods for accomplishing the same of the present invention will become more apparent through the following detailed description with respect to the accompanying drawings. However, the present invention is not limited by embodiments described blow and is implemented in various different forms, and the embodiments are provided so that this disclosure will be thorough and complete, and will fully convey the scope of the invention to those skilled in the art. The present invention is defined by the scope of the claims.

Shapes, sizes, ratios, angles, numbers, etc. shown in the figures to describe embodiments of the present invention are exemplary and thus are not limited to particulars shown in the figures. Like numbers refer to like elements throughout the specification. It will be further understood that when the terms "include", "have" and "comprise" are used in this specification, other parts may be added unless "~ only" is used. An element described in the singular form is intended to include a plurality of elements unless context clearly indicates otherwise. In interpretation of a component, the component is interpreted as including an error range unless otherwise explicitly described. When an element is referred to as being "on" or "under" another element, it can be "directly" on or under another element or can be "indirectly" formed such that an intervening element is also present.

In the following description of the embodiments, "first" and "second" are used to describe various components, but such components are not limited by these terms. The terms are used to discriminate one component from another component. Accordingly, a first component mentioned in the following description may be a second component within the technical spirit of the present invention. Features of embodiments of the present invention can be coupled or combined partially or overall and technically interoperated in various manners, and the embodiments may be implemented independently or associatively.

Hereinafter, embodiments of the present invention will be described in detail with reference to the attached drawings. The same reference numbers refer to the same components throughout this specification. In the following description, if a detailed description of known techniques associated with the present invention would unnecessarily obscure the gist of the present invention, detailed description thereof will be omitted.

Although examples of a display device according to an embodiment of the present invention may include an organic light-emitting display device, a liquid crystal display, an electrophoretic display device, and the like, the organic light-emitting display device is exemplified in the present invention. The organic light-emitting display device includes an organic light emitting layer formed of an organic material between a first electrode that is an anode and a second electrode that is a cathode. Accordingly, the organic light-emitting display device is a spontaneous emission display device which emits light according to energy generated when excitons, which are hole-electron pairs generated according to combination of holes supplied from the first electrode and electrons supplied from the second electrode in the organic light emitting layer, are dropped to the ground state.

Figure 2:
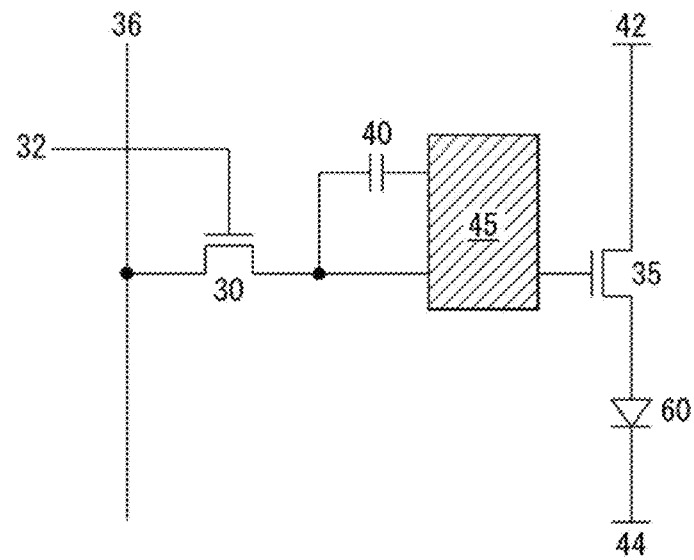
FIG. 2 is a schematic circuit diagram of a sub-pixel.

FIG. 1 is a schematic block diagram of an organic light-emitting display device and FIG. 2 is a schematic circuit diagram of a sub-pixel. As shown in FIG. 1, the organic light-emitting display device 10 includes an image processor 11, a timing controller 12, a data driver 13, a scan driver 14, and a display panel 20.

The image processor 11 outputs a data enable signal DE along with a data signal DATA supplied from an external device. Although the image processor 11 may also output one or more of a vertical synchronization signal, a horizontal synchronization signal and a clock signal in addition to the data enable signal DE, illustration of these signals is omitted for convenience of description.

In addition, the timing controller 12 is provided with the data signal DATA along with the data enable signal DE or driving signals including the vertical synchronization signal, the horizontal synchronization signal, the clock signal and the like from the image processor 11. The timing controller 12 outputs a gate timing control signal GDC for controlling operation timing of the scan driver 14 and a data timing control signal DDC for controlling operation timing of the data driver 13 based on the driving signals.

The data driver 13 samples and latches the data signal DATA supplied from the timing controller 12 in response to the data timing control signal DDC supplied from the timing controller 12 to convert the data signal DATA into a gamma reference voltage and outputs the gamma reference voltage. The data driver 13 outputs the data signal DATA through data lines DL1 to DLn. The data driver 13 may be configured in the form of an integrated circuit (IC).

Further, the scan driver 14 outputs a scan signal in response to the gate timing control signal GDC supplied from the timing controller 12. The scan driver 14 also outputs the scan signal through gate lines GL1 to GLm, and is configured in the form of an IC or configured as a gate in panel (GOP) in the display panel 20.

The display panel 20 displays an image in response to the data signal DATA and the scan signal supplied from the data driver 13 and the scan driver 14. As shown, the display panel 20 includes sub-pixels 50 that operate to display images. In more detail, the sub-pixels 50 include red, green and blue sub-pixels or include white, red, green and blue sub-pixels. The sub-pixels 50 may have one or more different emission areas according to emission characteristics.

As shown in FIG. 2, one sub-pixel includes a switching transistor 30, a driving transistor 35, a capacitor 40, a compensation circuit 45, and an organic light-emitting diode 60. The switching transistor 30 performs a switching operation such that a data signal supplied through a first data line 36 is stored as a data voltage in the capacitor 40 in response to a scan signal supplied through a first gate line 32. The driving transistor 35 operates to allow a driving current to flow between a power line (high voltage) 42 and a cathode power line (low voltage) 44 according to the data voltage stored in the capacitor 40. The organic light-emitting diode 60 operates to emit light according to the driving current generated by the driving transistor 35.

Further, the compensation circuit 45 is added to the sub-pixel in order to compensate for a threshold voltage of the driving transistor 35 and is composed of one or more transistors. The compensation circuit 45 is also configured in various manners according to external compensation methods, and an example thereof will be described below.

Figure 3:
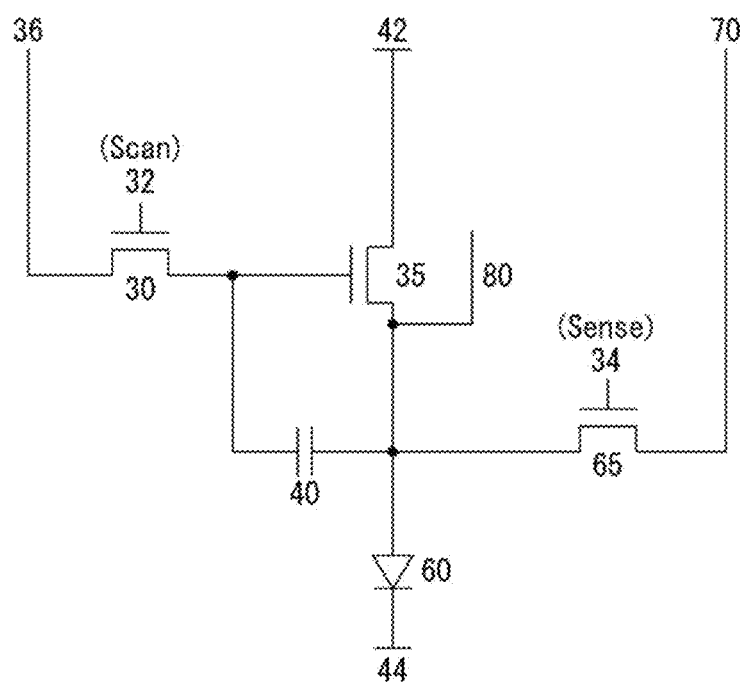
FIG. 3 is a detailed circuit diagram of the sub-pixel.

As shown in FIG. 3, the compensation circuit 45 includes a sensing transistor 65 and a sensing line (or a reference line) 70. The sensing transistor 65 is connected between the source electrode of the driving transistor 35 and the anode of the organic light-emitting diode 60 (connected to a sensing node). The sensing transistor 65 operates to supply an initialization voltage (or a sensing voltage) delivered through the sensing line 70 to the sensing node of the driving transistor 35 or to sense a voltage or current of the sensing node of the driving transistor 35 or the sensing line 70.

Further, as shown, the switching transistor 30 has a first electrode connected to the first data line 36 and a second electrode connected to the gate electrode of the driving transistor 35. Also, the driving transistor 35 has a first electrode connected to the power line 42 and a second electrode connected to the anode of the organic light-emitting diode 60. The capacitor 40 has a first electrode connected to the gate electrode of the driving transistor 35 and a second electrode connected to the anode of the organic light-emitting diode 60. In addition, the organic light-emitting diode 60 has the anode connected to the second electrode of the driving transistor 35 and the cathode connected to the second power line 44. The sensing transistor 65 has a first electrode connected to the sensing line 70 and a second electrode connected to the anode of the organic light-emitting diode 60 and the second electrode of the driving transistor 35.

The operating time of the sensing transistor 65 may be similar/identical to that of the switching transistor 30 according to an external compensation algorithm (or the configuration of the compensation circuit). For example, the gate electrode of the switching transistor 30 may be connected to the first gate line 32 and the gate electrode of the sensing transistor 65 may be connected to a second gate line 34. In this instance, a scan signal Scan is transmitted through the first gate line 32 and a sensing signal Sense is transmitted through the second gate line 34. As another example, the first gate line 32 connected to the gate electrode of the switching transistor 30 and the second gate line 34 connected to the gate electrode of the sensing transistor 65 may be connected such that they are commonly shared.

In addition, the sensing line 70 can be connected to the data driver. In this instance, the data driver can sense sensing nodes of sub-pixels and generate sensing results for a non-display period or N frames (N is an integer equal to or greater than 1) of an image in real time. Meanwhile, the switching transistor 30 and the sensing transistor 65 may be turned on at the same time. In this instance, a sensing operation through the sensing line 70 and a data output operation for outputting a data signal are separated (distinguished) from each other according to a time division operation of the data driver.

In addition, a compensation object according to sensing results may be a digital data signal, an analog data signal, gamma or the like. Further, a compensation circuit for generating a compensation signal (or a compensation voltage) based on sensing results may be configured in the data driver or the timing controller or configured as an additional circuit.

As shown in FIG. 3, a light shielding layer 80 may be disposed only under a channel region of the driving transistor 35 or disposed under channel regions of the switching transistor 30 and the sensing transistor 65 as well as the channel region of the driving transistor 35. The light shielding layer 80 can be simply used for the purpose of blocking external light or may be used as an electrode that is connected to other electrodes or lines and constitutes a capacitor and the like. Accordingly, a multi-level metal layer (multiple levels of dissimilar metals) is selected as the light shielding layer 80 such that it has light shielding characteristics.

Although a sub-pixel in a 3T(Transistor)1C(Capacitor) structure including the switching transistor 30, the driving transistor 35, the capacitor 40, the organic light-emitting diode 60 and the sensing transistor 65 has been described as an example in FIG. 3, a sub-pixel may be configured in 3T2C, 4T2C, 5T1C, 6T2C and the like when the compensation circuit 45 is added.

Figure 4:
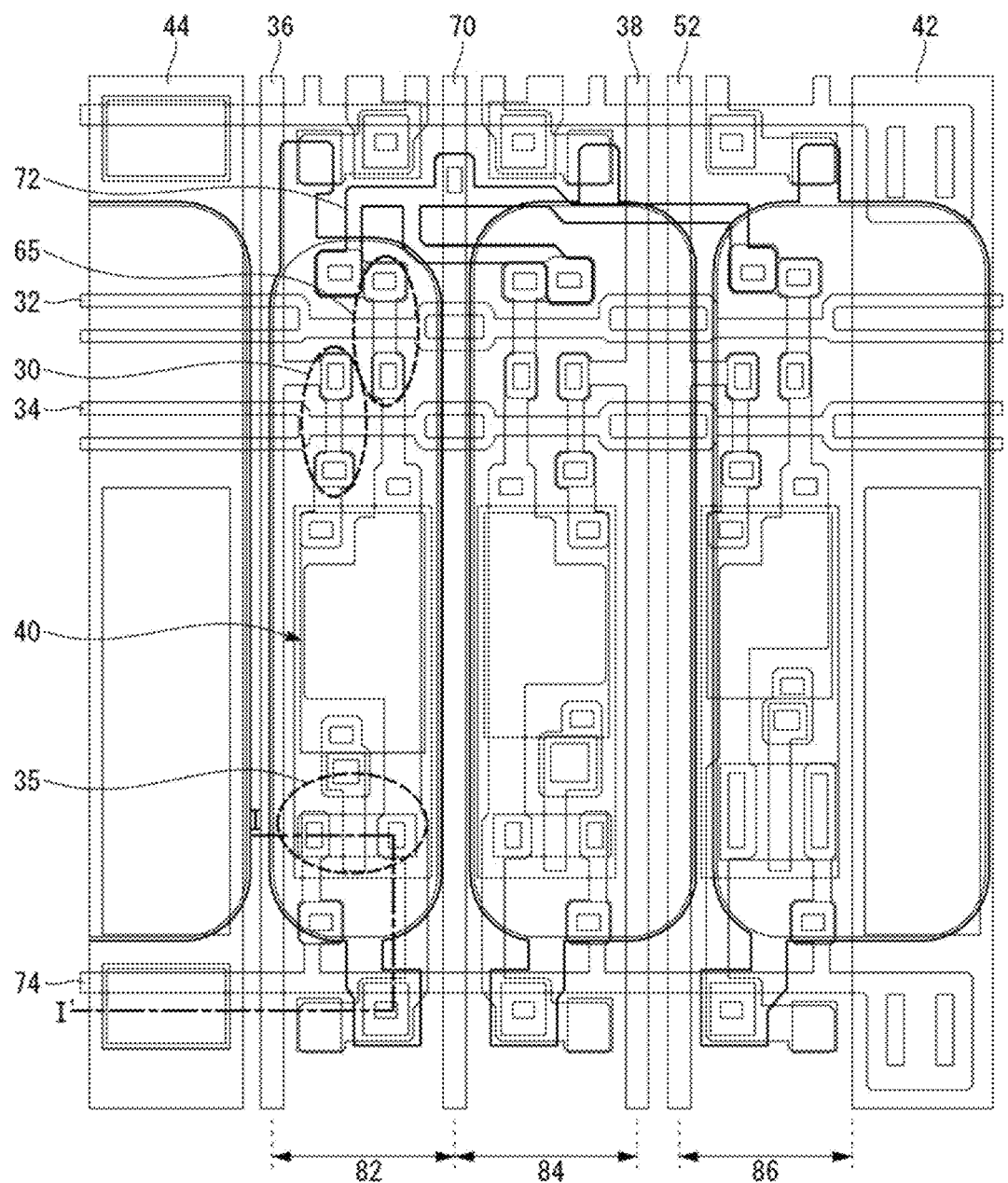
FIG. 4 is a schematic diagram showing a layout of sub-pixels according to an embodiment of the present invention.
Figure 5:
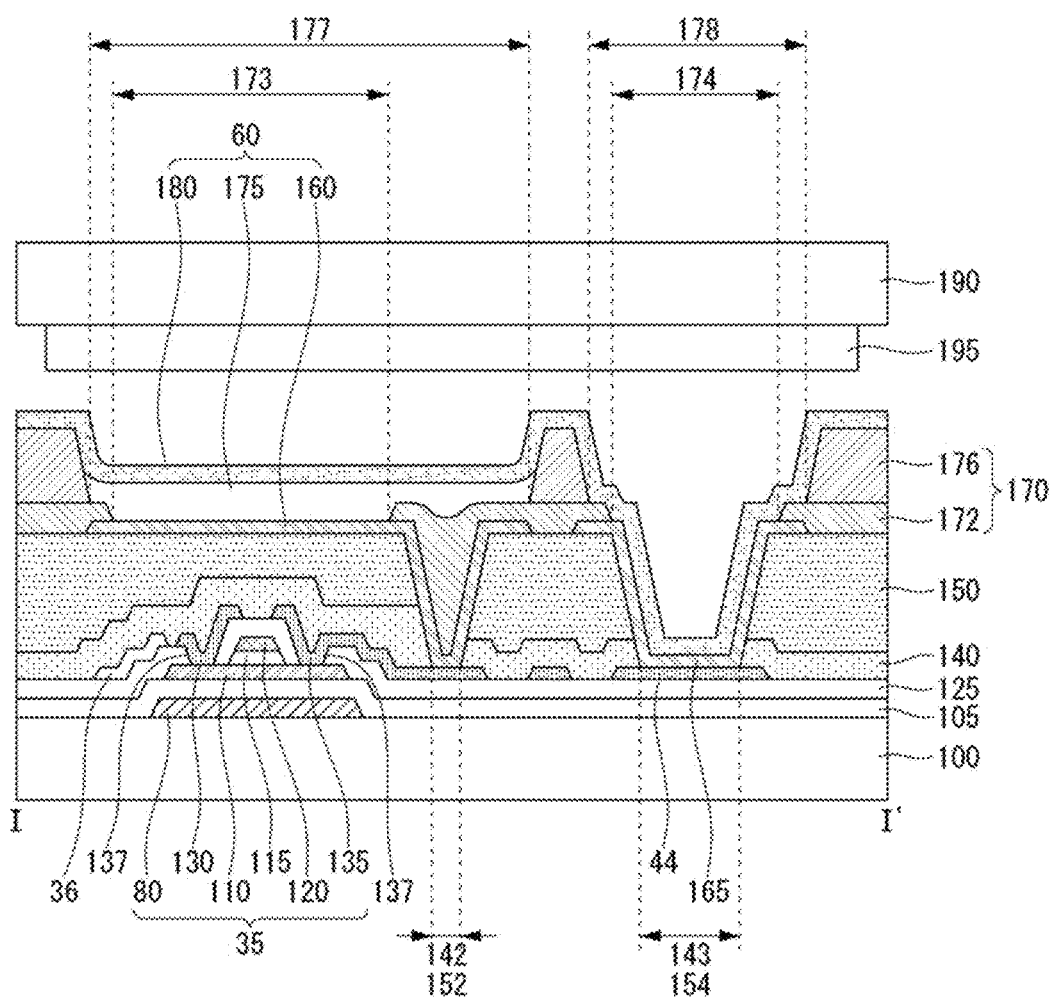
FIG. 5 is a cross-sectional view taken along line I-I' of FIG. 4.

Next, FIG. 4 is a schematic diagram showing a layout of sub-pixels according to an embodiment of the present invention, and FIG. 5 is a cross-sectional view taken along line I-I' of FIG. 4. Referring to FIG. 4, a first sub-pixel 82, a second sub-pixel 84 and a third sub-pixel 86 are formed in a display area of a substrate. A circuit including the organic light-emitting diode (light-emitting element), and the switching transistor 30, the sensing transistor 65 and the driving transistor 35 for driving the organic light-emitting diode is formed in each of the first, second and third sub-pixels 82, 84 and 86. In each of the first, second and third sub-pixels 82, 84 and 86, the organic light-emitting diode emits light in response to operations of the switching transistor 30, the sensing transistor 65 and the driving transistor 35. The power line 42, the sensing line 70 and the first to third data lines 36, 38 and 52 are disposed between the first, second and third sub-pixels 82, 84 and 86. The first and second gate lines 32 and 34 are disposed to cross the first, second and third sub-pixels 82, 84 and 86.

Although interconnection lines such as the power line 42, the sensing line 70 and the first to third data lines 36, 38 and 52 and the electrodes constituting the thin film transistors are disposed at different levels, they are electrically connected through contact holes (via holes). The sensing line 70 is connected to the sensing transistors 65 of the first, second and third sub-pixels 82, 84 and 86 through a sensing connection line 72. Further, the power line 42 is connected to the driving transistors 35 of the first, second and third sub-pixels 82, 84 and 86 through a power connection line 74. The first and second gate lines 32 and 34 are connected to the sensing and switching transistors 65 and 30 of the first, second and third sub-pixels 82, 84 and 86.

The aforementioned first sub-pixel 82 may be a red sub-pixel, the second sub-pixel 84 may be a green sub-pixel and the third sub-pixel 86 may be a blue sub-pixel. However, the positions at which the sub-pixels are disposed may be changed. A cross-sectional structure of the first sub-pixel among the first to third sub-pixels will be described as an example with reference to FIG. 5.

Referring to FIG. 5, the light shielding layer 80 is disposed on a substrate 100. The light shielding layer 80 serves to block external light to prevent photoelectric current from being generated in transistors. A buffer layer 105 is disposed on the light shielding layer 80. The buffer layer 105 serves to protect transistors formed through subsequent processes from impurities such as alkali ions leaking from the light shielding layer 80. The buffer layer 105 may be a silicon oxide (SiOx) layer, a silicon nitride (SiNx) layer or a multilayer thereof.

A semiconductor layer 110 of the driving transistor 35 is disposed on the buffer layer 105. The semiconductor layer 110 may be formed of silicon, an oxide or an organic semiconductor. A silicon semiconductor layer may be formed using amorphous silicon or polysilicon obtained by crystallizing amorphous silicon. An oxide semiconductor layer may be formed of any one of zinc oxide (ZnO), indium zinc oxide (InZnO), indium gallium zinc oxide (InGaZnO) and zinc tin oxide (ZnSnO). An organic semiconductor layer may be formed of a low molecular or high molecular organic material such as merocyanine, phthalocyanine, pentacene or thiophene polymer. The semiconductor layer 110 includes a drain region and a source region containing p-type or n-type impurities and a channel interposed therebetween.

A gate insulating layer 115 is disposed on the semiconductor layer 110 and may be a silicon oxide (SiOx) layer, a silicon nitride (SiNx) layer or a multilayer thereof. A gate electrode 120 is disposed on a region of the gate insulating layer 115 which corresponds to a predetermined region of the semiconductor layer 110, that is, a channel when impurities have been injected thereinto. Further, the gate electrode 120 is formed of any one selected from the group consisting of molybdenum (Mo), aluminum (Al), chrome (Cr), gold (Au), titanium (Ti), nickel (Ni), neodymium (Nd) and copper (Cu) or an alloy thereof. Further, the gate electrode 120 may be a multilayer formed of materials selected from a group consisting of molybdenum (Mo), aluminum (Al), chrome (Cr), gold (Au), titanium (Ti), nickel (Ni), neodymium (Nd) and copper (Cu) or alloys thereof. For example, the gate electrode 120 may be a double layer of molybdenum/aluminum-neodymium or molybdenum/aluminum.

An interlayer insulating layer 125 for insulating the gate electrode 120 is disposed on the gate electrode 120 and may be a silicon oxide (SiOx) layer, a silicon nitride (SiNx) layer or a multilayer thereof. Further, a source electrode 130 and a drain electrode 135 are disposed on the interlayer insulating layer 125. The source electrode 130 and the drain electrode 135 are connected to the semiconductor layer 110 through contact holes 137 which expose the source and drain regions of the semiconductor layer 110. In addition, the source electrode 130 and the drain electrode 135 may be formed of a single layer or a multilayer. When the source electrode 130 and the drain electrode 135 are a single layer, they may be formed of any one selected from the group consisting of molybdenum (Mo), aluminum (Al), chrome (Cr), gold (Au), titanium (Ti), nickel (Ni), neodymium (Nd) and copper (Cu) or an alloy thereof. Further, when the source electrode 130 and the drain electrode 135 are a multilayer, they may be formed of a double layer of molybdenum/ aluminum-neodymium or a tri-layer of titanium/aluminum/ titanium, molybdenum/aluminum/molybdenum or molybdenum/aluminum-neodymium/molybdenum.

The first data line 36 is disposed in a region distant from the driving transistor 35 and the cathode power line 44 is disposed in another region distant from the driving transistor 35. Accordingly, the driving transistor 35 including the semiconductor layer 110, the gate electrode 120, the source electrode 130 and the drain electrode 135 is formed.

As shown, a passivation layer 140 is disposed on the substrate 100 including the driving transistor 35. In more detail, the passivation layer 140 is an insulating layer for protecting elements formed thereunder and may be a silicon oxide (SiOx) layer, a silicon nitride (SiNx) layer or a multilayer thereof. The passivation layer 140 includes a first via hole 142 which exposes the drain electrode 135 of the driving transistor 35 disposed thereunder and a second via hole 143 which exposes the cathode power line 44.

In addition, an overcoat layer 150 is disposed on the passivation layer 140. In more detail, the overcoat layer 150 may be planarization layer for mitigating stepped portions of the understructure and may be formed of an organic material such as polyimide, benzocyclobutene series resin or acrylate. As shown, the overcoat layer 150 includes a third via hole 152 which exposes the first via hole 142 of the passivation layer 140 to expose the drain electrode 135 and a fourth via hole 154 which exposes the second via hole 143 of the passivation layer 140 to expose the cathode power line 44.

The organic light-emitting diode 60 is formed on the overcoat layer 150. The organic light-emitting diode 60 includes a first electrode 160 connected to the driving transistor 35, a second electrode 180 disposed opposite to the first electrode 160, and an organic light emitting layer 175 interposed between the first electrode 160 and the second electrode 180. The first electrode 160 may be an anode and the second electrode 180 may be a cathode.

The first electrode 160 is disposed on the overcoat layer 150 and may be connected to the drain electrode 135 of the driving transistor 35 through the third via hole 152 of the overcoat layer 150 and the first via hole 142 of the passivation layer 140. Although the first electrode 160 may be allocated per sub-pixel, the present invention is not limited thereto. The first electrode 160 may serve as a transmissive electrode by being formed of a transparent conductive material such as an indium tin oxide (ITO), indium zinc oxide (IZO) or zinc oxide (ZnO) or serve as a reflective electrode by including a reflective layer in accordance with an adopted emission method. The reflective layer may be formed of aluminum (Al), copper (Cu), silver (Ag), nickel (Ni) or an alloy thereof and preferably formed of APC (silver/palladium/copper alloy).

A connection pattern 165 connected to the cathode power line 44 through the fourth via hole 154 of the overcoat layer 150 and the second via hole 143 of the passivation layer 140 is disposed on a portion of the overcoat layer 150 which is separated from the first electrode 160. The connection pattern 165 is formed in the same structure as the first electrode 160.

A bank layer 170 is disposed on the substrate 100 on which the first electrode 160 is formed. The bank layer 170 includes a first bank layer 172 and a second bank layer 176. In addition, the first bank layer 172 includes a first opening 173 which exposes the first electrode 160 and the second bank layer 176 includes a second opening 177 which exposes a part of the first bank layer 172 and the first electrode 160. The second opening 177 may be formed to be larger than the first opening 173 to expose a part of the first bank layer 172.

In addition, the first bank layer 172 includes a third opening 174 which exposes the connection pattern 165 and the second bank layer 176 includes a fourth opening 178 which exposes a part of the first bank layer 172 and the connection pattern 165. The fourth opening 178 may be formed to be larger than the third opening 174 to expose a part of the first bank layer 172.

The organic light emitting layer 175 is disposed on the substrate 100 on which the bank layer 170 is formed. The organic light emitting layer 175 includes a light emitting layer (EL) and may further include at least one of a hole injection layer (HIL), a hole transport layer (HTL), an electron transport layer (ETL) and an electron injection layer (EIL). Further, the organic light emitting layer 175 may be coated through a solution process such as inkjet printing or nozzle coating and dried such that the top surface of the organic light emitting layer 175 which contacts the bank layer 170 can be rounded.

The second electrode 180 is disposed on the organic light emitting layer 175 and may be formed on the overall surface of the substrate 100. The second electrode 180 can serve as a transmissive electrode or a reflective electrode in accordance with an adopted emission method. When the second electrode 180 is a transmissive electrode, the second electrode 180 may be formed of a transparent conductive material such as ITO or IZO, or magnesium (Mg), calcium (Ca), aluminum (Al), silver (Ag) or an alloy thereof which is as thin as light can pass it. In addition, the second electrode 180 is connected to the cathode power line 44 by being connected to the connection pattern 165 through the third opening 174 of the first bank layer 172 and the fourth opening 178 of the second bank layer 176.

Further, an opposite substrate 190 is disposed opposite the substrate 100 on which the driving transistor 35 and the organic light-emitting diode 60 are formed. In more detail, the opposite substrate 190 is for sealing the substrate 100 and includes a color filter 195 disposed on the lower surface thereof. The color filter 195 may be a red color filter and serves to deepen color coordinates of red. For example, when the first sub-pixel is a red sub-pixel, the opposite substrate 190 may include a red color filter in a region corresponding to the first sub-pixel. In addition, regions of the opposite substrate 190 which correspond to the second sub-pixel that is a green sub-pixel and the third sub-pixel that is a blue sub-pixel may not include any color filter. However, the present invention describes an example and all sub-pixels may include color filters having colors corresponding thereto. The structure shown in FIG. 5 can be equally applied to not only the corresponding sub-pixels but also other sub-pixels.

The organic light-emitting display device described above with reference to FIGS. 1 to 5 will now be described in more detail below.

First Embodiment

Figure 6:
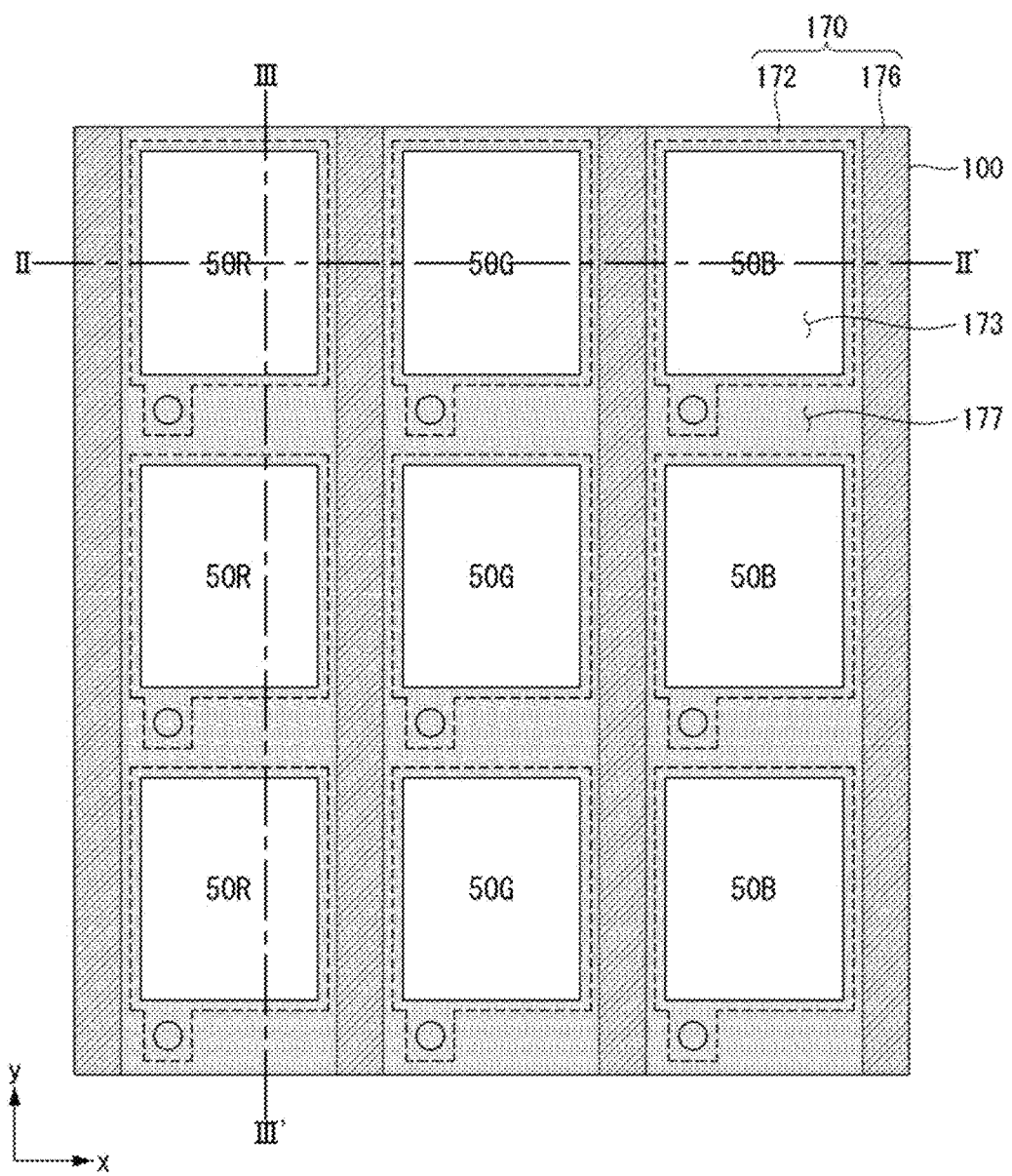
FIG. 6 is a plan view showing an organic light-emitting display device according to a first embodiment of the present invention.
Figure 7:
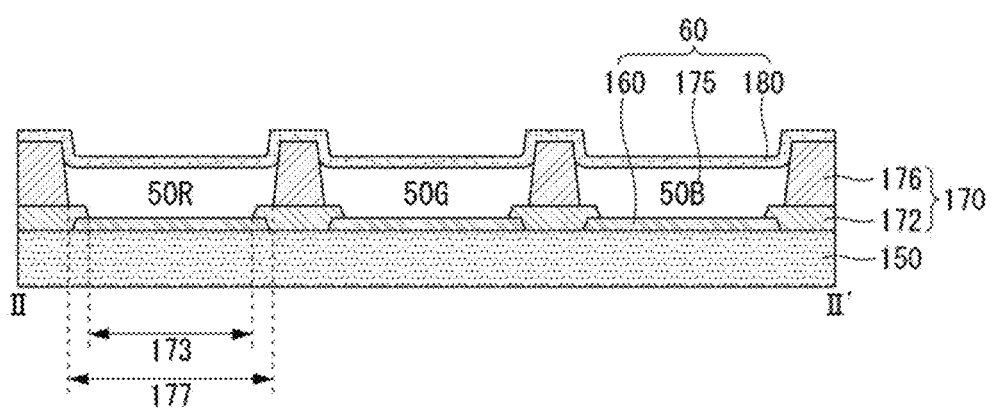
FIG. 7 is a cross-sectional view taken along line II-II' of FIG. 6.
Figure 8:
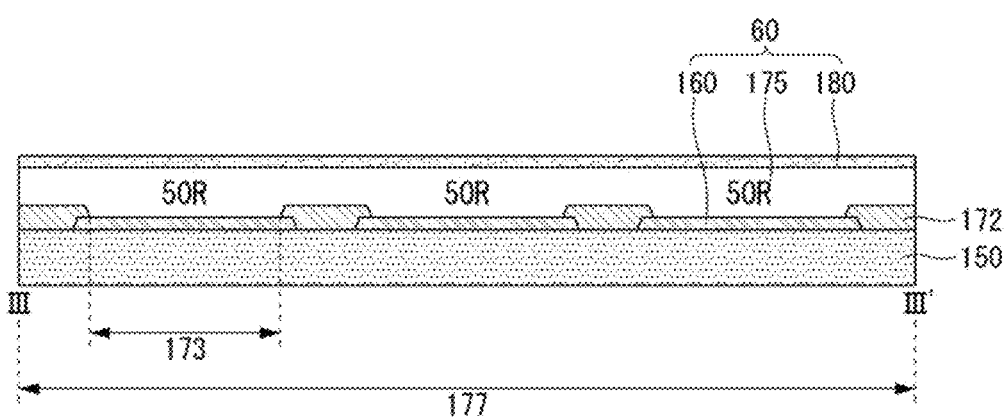
FIG. 8 is a cross-sectional view taken along line of FIG. 6.
Figure 9:
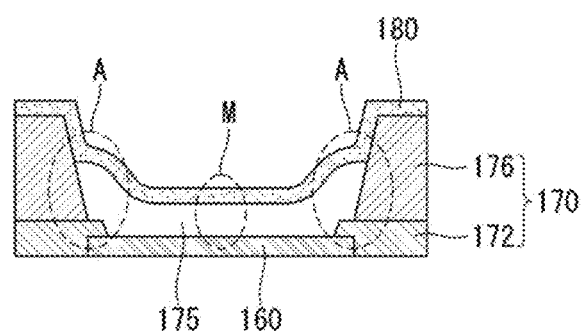
FIG. 9 is a cross-sectional view showing thickness non-uniformity of an organic light emitting layer in a solution process.
Figure 10:
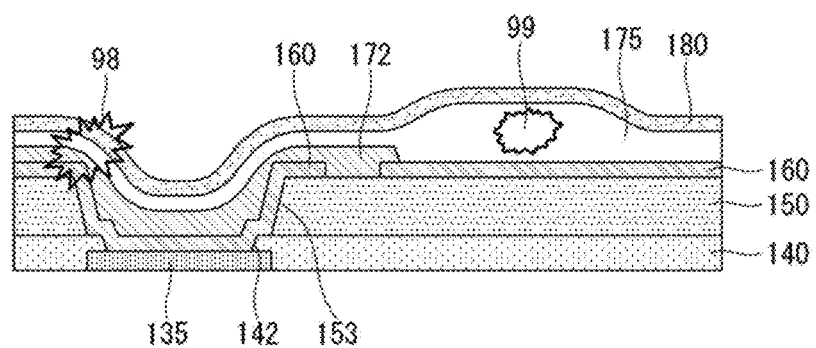
FIG. 10 is a cross-sectional view showing defects in an organic light-emitting diode caused by particles.

FIG. 6 is a plan view showing the organic light-emitting display device according to a first embodiment of the present invention, FIG. 7 is a cross-sectional view taken along line II-II' of FIG. 6, FIG. 8 is a cross-sectional view taken along line III-III' of FIG. 6, FIG. 9 is a cross-sectional view showing thickness non-uniformity of an organic light emitting layer in a solution process, and FIG. 10 is a cross-sectional view showing defects in an organic light-emitting diode caused by particles.

Referring to FIGS. 6 and 7, the organic light-emitting display device according to the first embodiment of the present invention includes the substrate 100 on which a plurality of sub-pixels 50R, 50G and 50B are arranged. The substrate 100 may have various plane shapes. For example, the substrate 100 may have square, circular and oval shapes as well as a rectangular shape shown in the figures.

The aforementioned thin film transistors, capacitor and organic light-emitting diode are disposed on the substrate 100. The organic light-emitting diode 60 includes the first electrode 160, the organic light emitting layer 175 and the second electrode 180. Emission regions of the sub-pixels 50R, 50G and 50B are defined by the bank layer 170. The bank layer 170 is described in detail in FIG. 6 and thus illustration of other components is omitted.

The sub-pixels 50R, 50G and 50B may be arranged in a first direction (e.g., x-axis direction) and a second direction (e.g., y-axis direction) which intersect each other. Sub-pixels arranged in the first direction can emit light having different colors and sub-pixels arranged in the second direction can emit light having the same color. For example, the red sub-pixel 50R, the green sub-pixel 50G and the blue sub-pixel 50B can be repeatedly arranged in the first direction, and the sub-pixels arranged in the second reaction can be arranged so the red sub-pixels 50R are arranged in the first column, the green sub-pixels 50G are arranged in the second column and the blue sub-pixels 50B are arranged in the third column. However, the present invention describes an example of sub-pixel arrangement and the sub-pixels can be arranged in various manners.

The first electrode 160 of the organic light-emitting diode is disposed on each of the sub-pixels 50R, 50G and 50B. In addition, the bank layer 170 is disposed on the first electrode 160 to define an emission region and includes the first bank layer 172 and the second bank layer 176.

The first bank layer 172 is positioned on the first electrode 160 to cover the edge of the first electrode 160. The first bank layer 172 includes the first openings 173 each of which exposes at least a part of the first electrode 160. One first opening 173 exposes one first electrode 160. Accordingly, the first openings 173 can one-to-one correspond to the first electrodes 160.

Further, the first bank layer 172 can be formed to be relatively thin such that it can be covered by an organic light emitting layer formed thereon. The first bank layer 172 can also have hydrophilicity and be formed of a hydrophilic inorganic material such as silicon oxide (SiOx) or silicon nitride (SiNx), for example.

Although FIG. 6 illustrates an example in which the first openings 173 have a rectangular shape, the present invention is not limited thereto. Further, FIG. 6 illustrates that the first openings 173 have the same shape and area, but the present invention is not limited thereto and at least one first opening 173 may have a shape and/or an area different from those of other ones. For example, the shapes and/or the areas of the first openings 173 may be appropriately selected in consideration of the durability of an organic light emitting material for forming the organic light emitting layer of the organic light-emitting diode. Further, a region of the first electrode 160 exposed by the first opening 173 can be defined as an emission region.

In addition, the second bank layer 176 is disposed on the substrate 100 on which the first bank layer 172 is formed and is positioned between sub-pixels emitting lights having different colors among the sub-pixels. The second bank layer 176 includes the second openings 177 each of which exposes at least a part of the first electrode 160. Further, the second openings 177 are arranged in parallel in the first direction and extend in the second direction. The second openings 177 also extend in the second direction to expose the first electrodes 160 of the sub-pixels arranged in the second direction. Further, the second openings 177 extend in the second direction to expose the first openings 173 arranged in the second direction.

The second bank layer 176 may also have hydrophobicity. For example, the second bank layer 176 can be formed by coating a hydrophobic material on an insulating layer or formed of a hydrophobic material. The second bank layer 176 may also be formed of an organic material. In addition, the organic light emitting material of the organic light emitting layer can converge on the center of the emission region according to hydrophobicity of the second bank layer 176. Further, the second bank layer 176 can serve as a barrier that confines organic light emitting materials dropped on the corresponding regions to prevent organic light emitting materials having different colors from being mixed.

Although FIG. 6 illustrates an example in which the second openings 177 have a bar shape, the present invention is not limited thereto. In addition, FIG. 6 illustrates that the second openings 177 have the same shape and area, but the present invention is not limited thereto and at least one second opening 177 may have a shape and/or an area different from those of other ones. For example, the shapes and/or the areas of the second openings 177 may be appropriately selected in consideration of the durability of the organic light emitting material.

The second openings 177 are positioned distant from the outer sides of the first openings 173. That is, the boundary of the first bank layer 172 is separated from the boundary of the second bank layer 176 by a predetermined distance. Accordingly, the first openings 173 can be exposed by the second openings 177 and the first bank layer 172 can be exposed by the second bank layer 176.

Next, the structures of the first electrode, the bank layers, the organic light emitting layer and the second electrode will be described with reference to FIGS. 7 and 8. In FIGS. 7 and 8, the structures under the overcoat layer 150 are omitted and the structures of the first electrode, the bank layers, the organic light emitting layer and the second electrode are described in detail. The omitted structures under the overcoat layer 150 include the semiconductor layer 110, the gate electrode 120, the source electrode 130 and the drain electrode 135 of the driving transistor 35 disposed under the first electrode 160 in FIG. 5. Further, the light shielding layer 80 disposed under the driving transistor 35 and the cathode power line 44 disposed in a region distant from the driving transistor 35 are also omitted.

As shown, the first electrodes 160 of the respective sub-pixels are disposed on the overcoat layer 150, and the edges of the first electrodes 160 are covered by the first bank layer 172 and thus parts thereof are exposed. The second bank layer 176 is also positioned on the first bank layer 172.

Further, the organic light emitting layer 175 is disposed on the substrate on which the second bank layer 176 is formed. The organic light emitting layer 175 are also formed in the second openings 177 of the second bank layer 176 in a direction in which the second openings 177 extend. That is, the organic light emitting material dropped (e.g., deposited) on one second opening 177 covers the first electrodes 160 and the first bank layer 172 exposed by the second opening 177. The organic light emitting material also completely covers the first bank layer 172 and thus is not separated by the first bank layer 172 but is separated by the second band layer 176.

In addition, an organic light emitting material having a color is deposited on a plurality of first electrodes 160 exposed by one second opening 177. This means that sub-pixels allocated to a region corresponding to one second opening 177 emit light having the same color. The plane shape of the organic light emitting layer 175 corresponds to the plane shape of the second opening 177 and may be a bar shape, for example.

Organic light emitting materials having different colors can also be sequentially alternately deposited on corresponding second openings 177. The organic light emitting materials having different colors include, for example, organic light emitting materials emitting red, green and blue lights.

Further, the second bank layer 176 is positioned between first electrodes 160 neighboring in the first direction (x-axis direction of FIG. 6) to prevent organic light emitting materials having different colors deposited on the second openings 177 neighboring in the first direction from being mixed. That is, organic light emitting materials having different colors deposited on different second openings 177 are physically separated by the second bank layer 176.

In addition, an organic light emitting material used to form the organic light emitting layer 175 is deposited to cover at least a part of the first electrode 160, a part of the first bank layer 172 and a part of the second bank layer 176 in a solution process. The first bank layer 172 may also be formed from a hydrophilic thin film for preventing wettability deterioration due to hydrophobicity of the first electrode 160 to induce a hydrophilic organic light emitting material to well spread. Further, the second bank layer 176 is a hydrophobic thick film and causes the hydrophilic organic light emitting material to converge on the center region. The organic light emitting layer 175 can also be formed to a relatively uniform thickness in the emission region according to the structures of the first bank layer 172 and the second bank layer 176.

In the present invention, a plurality of sub-pixels emitting light having the same color may be allocated to one second opening 177. If the second openings 177 expose respective sub-pixels, organic light emitting materials deposited on the second openings 177 may have different thicknesses due to an equipment deviation during the solution process. In more detail, the equipment deviation refers to a discharge rate deviation between nozzles of an inkjet apparatus. That is, nozzles used to deposit organic light emitting materials to the second openings 177 may not have a uniform discharge rate. In this instance, organic light emitting materials deposited on sub-pixels through nozzles allocated to the sub-pixels may have different thicknesses according to locations.

Accordingly, the present invention allocates a plurality of sub-pixels emitting the same color light to one second opening 177 and allocates a plurality of nozzles corresponding to the number of sub-pixels, and thus a discharge rate deviation between nozzles can be compensated and organic light emitting materials deposited on the second openings 177 can have a uniform thickness.

Accordingly, the organic light-emitting display device according to an embodiment of the present invention can prevent the deterioration of thickness uniformity of the organic light emitting layer 175 to prevent display quality deterioration caused by a thickness deviation in sub-pixels. In addition, the uniformity of the organic light emitting layer 175 can be secured to prevent a decrease in the lifespan of elements and defects with respect to generation of dark spots.

The aforementioned predetermined distance between the boundary of the first bank layer 172 and the boundary of the second bank layer 176 refers to a minimum distance that can secure thickness uniformity of the organic light emitting layer 175. If the boundary of the first bank layer 172 and the boundary of the second bank layer 176 are closer to each other than the predetermined distance, the uniformity of the organic light emitting layer 175 cannot be secured. If the boundary of the first bank layer 172 and the boundary of the second bank layer 176 are separated from each other by more than the predetermined distance, the area of the first electrode 160 covered by the first bank layer 172 may increase to decrease an aperture ratio.

In the organic light-emitting display device according to an embodiment of the present invention, the second bank layer 176 is not disposed between sub-pixels arranged in the second direction because the second openings 177 of the second bank layer 176 extend in the second direction. Accordingly, the present invention can improve the degree of freedom in design and secure a wide emission region on the first electrode 160 because the aforementioned positional restriction on the first bank layer 172 is relatively reduced. Hence, the present invention can provide an organic light-emitting display device with an improved degree of freedom in design and a sufficient aperture ratio.

Furthermore, the areas of sub-pixels arranged in a display device relatively decrease as resolution increases. In this instance, organic light emitting materials are not deposited at proper positions and thus color mixing of organic light emitting layers 175 having different colors may occur. The present invention can secure a sufficient organic light emitting material dispensing area in the wide second opening 177 corresponding to a plurality of sub-pixels to prevent color mixing.

Referring to FIG. 9, when the organic light emitting layer 175 is formed using a solution process, a pile up phenomenon may occur to deteriorate the emission characteristic of the organic light-emitting display device. Specifically, an organic light emitting material is deposited on the first electrode 160 defined by the bank layer 170 through an inkjet apparatus or the like. The deposited organic light emitting material, that is, the organic light emitting layer has a thickness deviation according to location due to a curing rate difference and stepped portions disposed thereunder during a curing process. That is, a thickness of the organic light emitting layer is formed thick at the edge portion A in contact with the bank layer, and is formed thin at the center portion M. Thus, the thickness of the organic light emitting layer is formed non-uniform.

When the organic light emitting layer 175 is non-uniformly formed as described above, the luminance deviation according to location may be generated to decrease display quality. Further, a current density difference may be generated in the organic light emitting layer 175 to reduce the lifespan of elements or dark spots may be generated to decrease process yield. In view of this, it is preferable to minimize an area in which the pile up phenomenon occurs in formation of a light emitting layer using a solution process.

Referring to FIG. 10, the first electrode 160 is connected to the drain electrode 135 through the first via hole 142 of the passivation layer 140 and the third via hole 153 of the overcoat layer 150 which expose the drain electrode 135, as described with reference to FIG. 5. The first bank layer 172 is also formed on the first electrode 160 to be thinner at a stepped portion of the first electrode 160 due to stepped portions of the first via hole 142 and the third via hole 153. When a particle 99 is present on the neighboring first electrode 160, the organic light emitting material deposited on the first electrode 160 is concentrated to the particle 99 and thus the organic light emitting layer 175 is formed relatively thick around the particle 99 and formed relatively thin in other regions. Accordingly, the stepped portion of the first electrode 160 may be exposed from the first bank layer 172 and the organic light emitting layer 175 to generate a short-circuit 98 with respect to the second electrode 180. Consequently, dark spots due to short-circuit between the first electrode 160 and the second electrode 180 may be generated.

To prevent this, the first bank layer 172 is formed thick on the third via hole 153 of the overcoat layer 150 through which the first electrode 160 is connected to the drain electrode 135 of the driving transistor in the first embodiment of the present invention.

Figure 11:
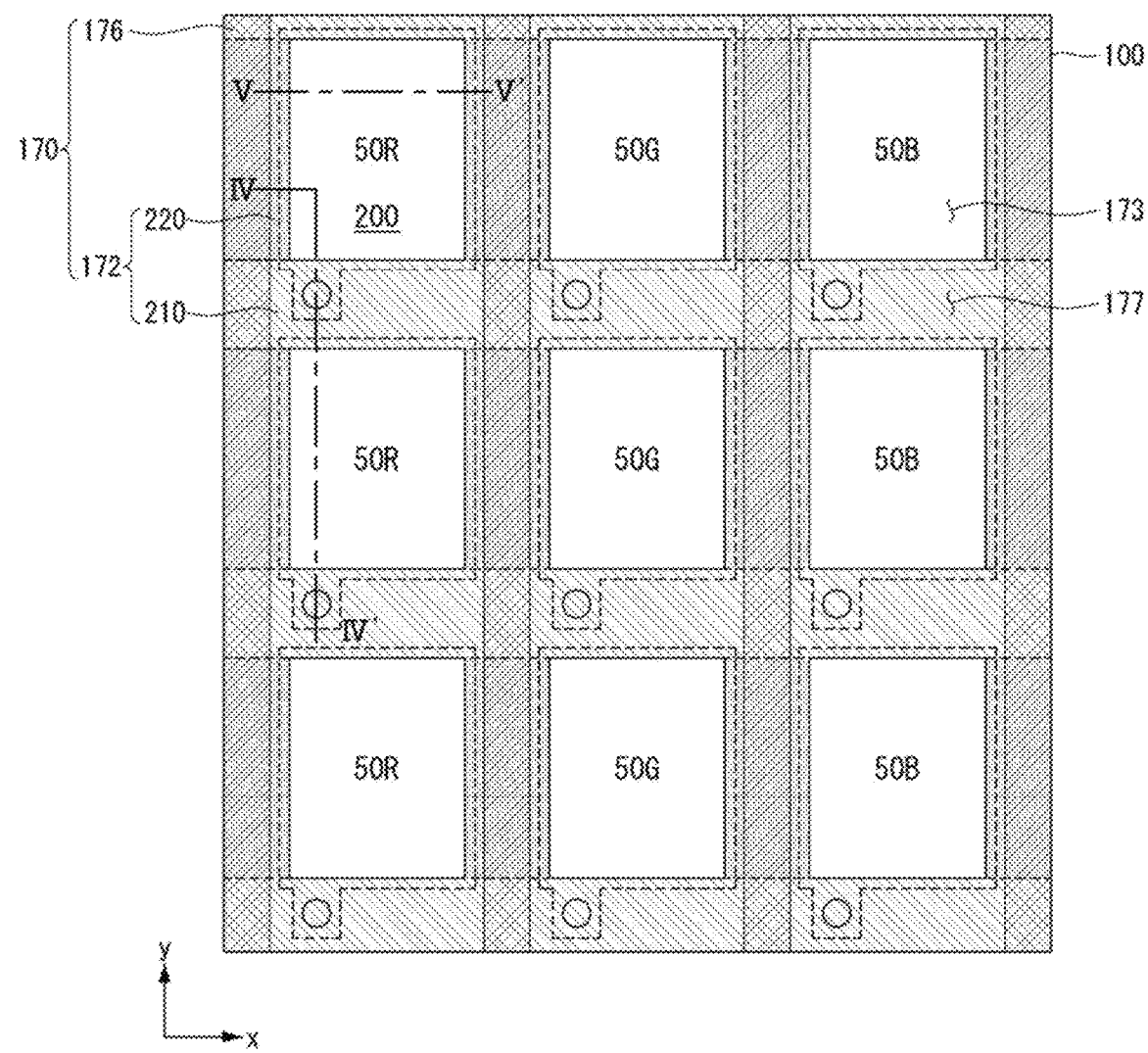
FIG. 11 is a plan view showing the organic light-emitting display device according to the first embodiment of the present invention.
Figure 12:
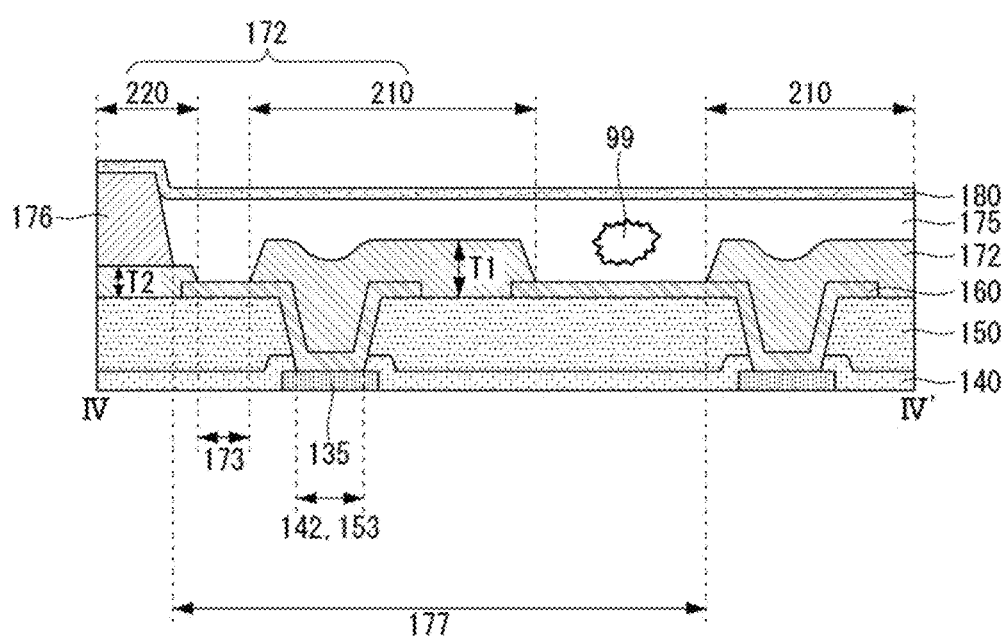
FIG. 12 is a cross-sectional view taken along line IV-IV' of FIG. 11.
Figure 13:
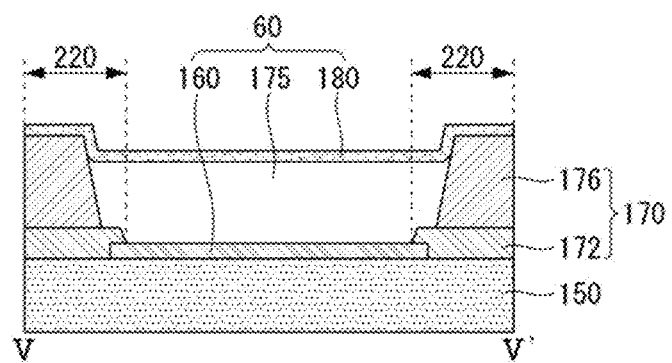
FIG. 13 is a cross-sectional view taken along line V-V' of FIG. 11.

Next, FIG. 11 is a plan view showing the organic light-emitting display device according to the first embodiment of the present invention, FIG. 12 is a cross-sectional view taken along line IV-IV' of FIG. 11, and FIG. 13 is a cross-sectional view taken along line V-V' of FIG. 11.

Referring to FIG. 11, the sub-pixels 50R, 50G and 50B include emission regions 200 defined by the first bank layer 172. The first bank layer 172 may include relatively thick regions. Specifically, the first bank layer 172 may include first regions 210 that are relatively thick and second regions 220 thinner than the first regions 210. The first regions 210 may be defined as regions which are disposed between the emission regions 200 of the sub-pixels 50R arranged in the second direction (y-axis direction) and extend in the first direction (x-axis direction). In FIG. 11, the first direction is a direction in which the shorter sides of the sub-pixels 50R, 50G and 50B extend and the first regions 210 extend in parallel with the direction in which the shorter sides of the sub-pixels 50R, 50G and 50B extend. Further, the first bank layer 172 is disposed in an area other than the emission regions 200 of the sub-pixels 50R, 50G and 50B. The first regions 210 of the first bank layer 172 may also be regions disposed between the emission regions 200 of the sub-pixels 50R (or the sub-pixels 50G or the sub-pixels 50B) arranged in the second direction. In other words, the first regions 210 of the first bank layer 172 may be regions disposed between sub-pixels emitting the same color light.

In addition, the second regions 220 are defined as regions which are disposed between the emission regions 200 of the sub-pixels 50R, 50G and 50B arranged in the first direction and extend in the second direction. The second regions 220 are regions disposed between sub-pixels emitting light having different colors. The second regions 220 may be regions of the first bank layer 172 other than the first regions 210.

Further, the first regions 210 intersect the longitudinal direction (y-axis direction) of the second regions 220 to cut off the second regions 220. Accordingly, the first regions 210 are formed in a bar shape continuously extending from one side to the other side of the substrate, whereas the second regions 220 are separately disposed having the first region 210 interposed therebetween. In addition, the first regions 210 overlap with the second bank layer 176 while intersecting the second bank layer 176. As shown, the second regions 220 do not overlap with the first regions 210 but overlap with the second bank layer 176.

The first regions 210 of the first bank layer 172 overlap with at least the third via hole 153 through which the first electrode 160 is connected to the drain electrode 135. Specifically, referring to FIG. 12, the passivation layer 140 including the first via hole 142 which exposes the drain electrode 135 is disposed on the drain electrode 135 of the driving transistor. In addition, the overcoat layer 150 including the third via hole 154 which exposes the drain electrode 135 is disposed on the passivation layer 140. The first electrode 160 connected to the drain electrode 135 through the first and third via holes 142 and 153 is disposed on the overcoat layer 150. Also, the first bank layer 172 including the first opening 173 which exposes the first electrode 160 is disposed on the first electrode 160 is disposed on the first bank layer 172, and the second bank layer 176 including the second opening 177 which exposes the first opening 173 is disposed on the first bank layer 172. The organic light emitting layer 175 is disposed in the second opening 177 and the second electrode 180 is disposed on the second bank layer 176 and the organic light emitting layer 175.

In addition, the first regions 210 of the first bank layer 172 overlap with the third via hole 153 and have a first thickness T1 such that they can completely cover the third via hole 153. As shown in FIG. 10, since the third via hole 153 has a high stepped portion, the first regions 210 can mitigate the stepped portion of the third via hole 153 when the first regions 210 overlapping with the third via hole 153 have a sufficient thickness T1. Accordingly, it is possible to prevent the first electrode 160 formed in the third via hole 153 from being exposed from the first bank layer 172 by forming the first regions 210 of the first bank layer 172 thick. Furthermore, even when the particle 99 is present, the thick first regions 210 of the first bank layer 172 can inhibit the flow of an organic light emitting material to prevent formation of an organic light emitting layer having an non-uniform thickness.

Further, the second regions 220 of the first bank layer 172 have a second thickness T2 less than the first thickness T1. The second regions 220 also overlap with the second bank layer 176, and an organic light emitting layer having an non-uniform thickness can be formed due to the thickness of the first bank layer 172 as shown above in FIG. 9. Accordingly, the second regions 220 of the first bank layer 172 can be formed as thin as possible.

In addition, the first regions 210 and the second regions 220 of the first bank layer 172 may be formed by depositing a first bank layer material on the substrate and then forming the first regions 210 and the second regions 220 having different thicknesses using a half-tone mask.

As shown in FIG. 13, when the second regions 220 of the first bank layer 172 are formed thin, a height difference between the first electrode 160 and the first bank layer 172 is reduced and thus the organic light emitting layer 175 can be formed to have a uniform thickness. That is, the organic light emitting layer 175 having a uniform thickness at the edges thereof in contact with the bank layer 170 and the center part thereof can be formed.

Accordingly, a luminance deviation according to location can be reduced to improve display quality since the organic light emitting layer 175 having a uniform thickness is formed. Furthermore, a current density difference in the organic light emitting layer 175 can be reduced to prevent decrease in the lifespan of elements and generation of dark spots, improving process yield.

Second Embodiment

Figure 14:
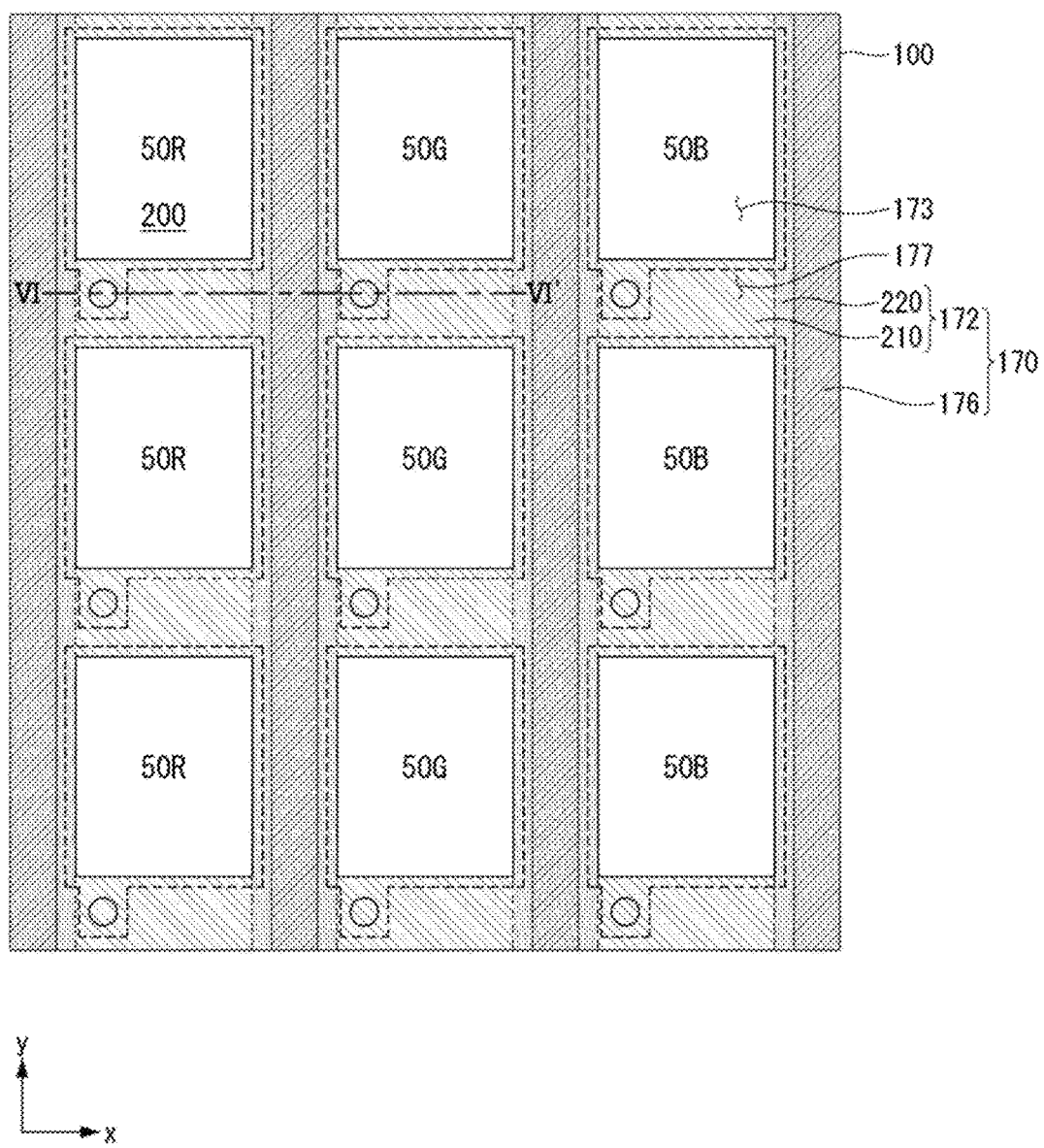
FIG. 14 is a plan view showing an organic light-emitting display device according to a second embodiment of the present invention.
Figure 15:
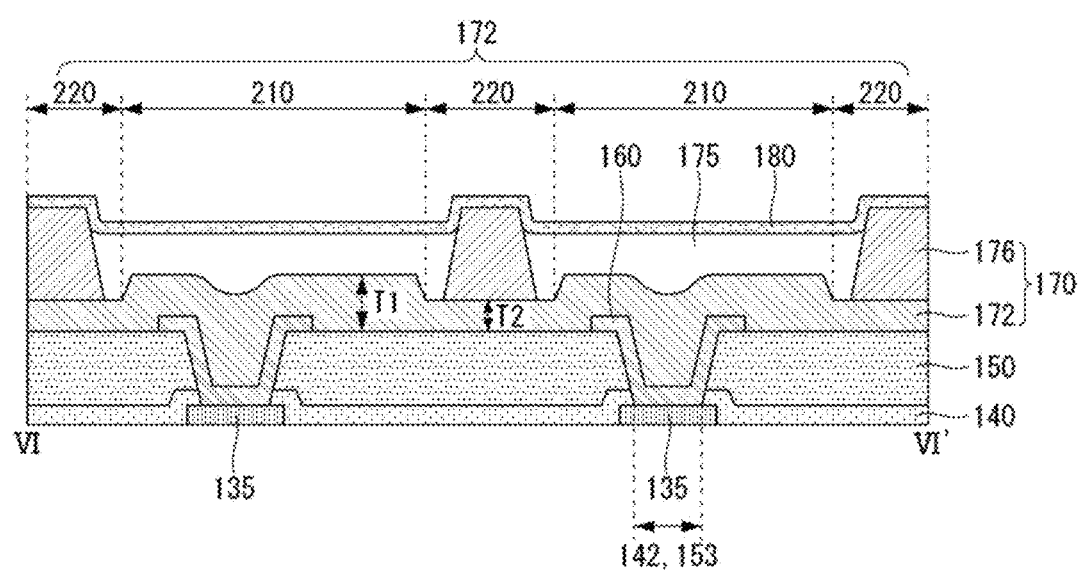
FIG. 15 is a cross-sectional view taken along line VI-VI' of FIG. 14.

FIG. 14 is a plan view showing an organic light-emitting display device according to a second embodiment of the present invention and FIG. 15 is a cross-sectional view taken along line VI-VI' of FIG. 14. Referring to FIG. 14, the sub-pixels 50R, 50G and 50B include emission regions 200 defined by the first bank layer 172, and the first bank layer 172 may include relatively thin regions.

Specifically, the first bank layer 172 may include first regions 210 that are relatively thick and the second regions 220 thinner than the first regions 210. The first regions 210 are defined as regions which are disposed between the emission regions 200 of the sub-pixels 50R arranged in the second direction (y-axis direction). The first bank layer 172 is disposed in an area other than the emission regions 200 of the sub-pixels 50R, 50G and 50B. Also, the first regions 210 of the first bank layer 172 are regions disposed between the emission regions 200 of the sub-pixels 50R (or the sub-pixels 50G or the sub-pixels 50B) arranged in the second direction. In other words, the first regions 210 of the first bank layer 172 are regions disposed between sub-pixels emitting the same color light.

Further, the second regions 220 are defined as regions which are disposed between the emission regions 200 of the sub-pixels 50R, 50G and 50B arranged in the first direction and extend in the second direction. That is, the second regions 220 extend in parallel with the direction in which the longer sides of the plurality of sub-pixels 50R, 50G and 50B extend. Further, the second regions 220 may be regions disposed between sub-pixels emitting light having different colors. The second regions 220 may also be the regions of the first bank layer 172 other than the first regions 210.

In addition, the second embodiment differs from the above-described first embodiment in that the first regions 210 are separately disposed and the second regions 220 may continuously extend. Specifically, the second regions 220 intersect the longitudinal direction (x-axis direction) of the first regions 210 to cut off the first regions 210. Accordingly, the second regions 220 are formed in a bar shape continuously extending from one side to the other side of the substrate, whereas the first regions 210 are separately disposed having the second region 220 therebetween. In addition, the second regions 220 are disposed in parallel with the second bank layer 176 and overlap with the second bank layer 176. The first regions 210 do not overlap with the second regions 220 and the second bank layer 176.

Further, the first regions 210 of the first bank layer 172 overlap with at least the third via hole 153 through which the first electrode 160 is connected to the drain electrode 135. Specifically, referring to FIG. 15, the first regions 210 of the first bank layer 172 overlap with the third via hole 153 and have a first thickness T1 such that they completely cover the third via hole 153. Since the third via hole 153 has a high stepped portion, the first regions 210 can mitigate the stepped portion of the third via hole 153 when the first regions 210 overlapping with the third via hole 153 have a sufficient thickness T1. Accordingly, it is possible to prevent the first electrode 160 formed in the third via hole 153 from being exposed from the first bank layer 172 by forming the first regions 210 of the first bank layer 172 thick.

Further, the second regions 220 of the first bank layer 172 have a second thickness T2 less than the first thickness T1. The second regions 220 overlap with the second bank layer 176, and an organic light emitting layer having a non-uniform thickness may be formed due to the thickness of the first bank layer 172. Accordingly, the second regions 220 of the first bank layer 172 can be formed as thin as possible.

When the second regions 220 of the first bank layer 172 are formed thin, a height difference between the first electrode 160 and the first bank layer 172 is reduced and thus the organic light emitting layer 175 can be formed to have a uniform thickness. That is, the organic light emitting layer 175 having a uniform thickness at the edges thereof in contact with the bank layer 170 and the center part thereof can be formed. Accordingly, a luminance deviation according to location can be reduced to improve display quality since the organic light emitting layer 175 having a uniform thickness is formed. Furthermore, a current density difference in the organic light emitting layer 175 can be reduced to prevent decrease in the lifespan of elements and generation of dark spots, improving process yield.

Third Embodiment

Figure 16:
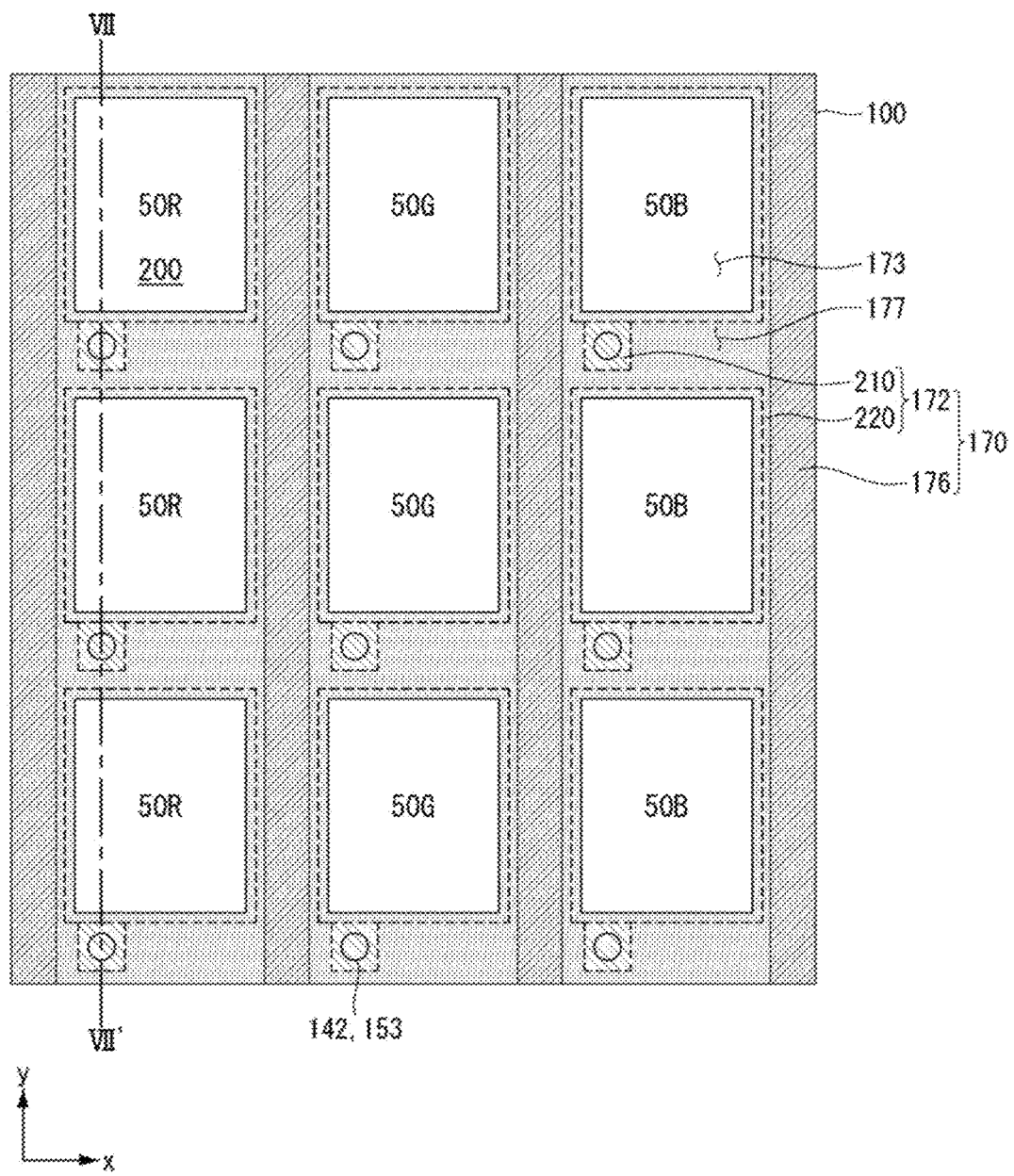
FIG. 16 is a plan view showing an organic light-emitting display device according to a third embodiment of the present invention.
Figure 17:
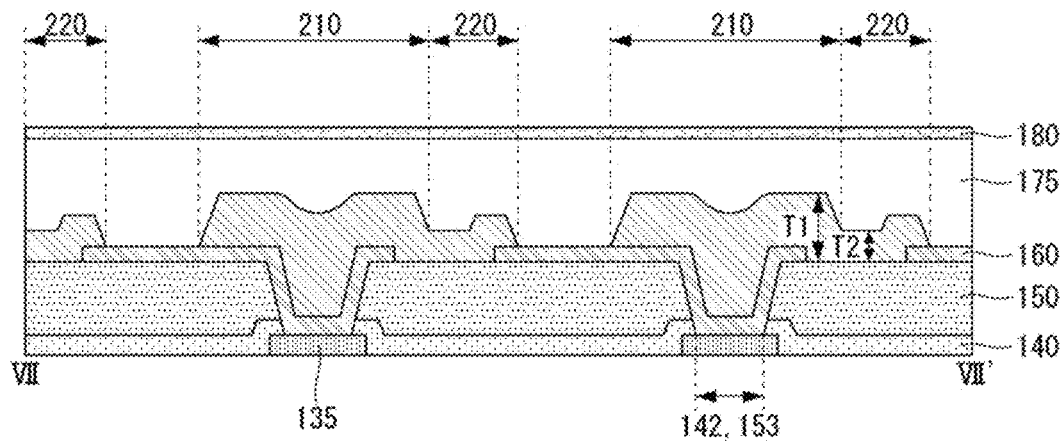
FIG. 17 is a cross-sectional view taken along line VII-VII' of FIG. 16.

FIG. 16 is a plan view showing an organic light-emitting display device according to a third embodiment of the present invention and FIG. 17 is a cross-sectional view taken along line VII-VII' of FIG. 16. Referring to FIG. 16, the sub-pixels 50R, 50G and 50B include emission regions 200 defined by the first bank layer 172. The first bank layer 172 may include relatively thin regions.

Specifically, the first bank layer 172 includes first regions 210 that are relatively thick and second regions 220 thinner than the first regions 210. The first regions 210 are disposed between the emission regions 200 of the sub-pixels 50R arranged in the second direction (y-axis direction). Also, the first regions 210 are regions disposed between sub-pixels emitting the same color light. Further, the first regions 210 are defined as regions overlapping with the third via hole 153 of the overcoat layer 150. That is, the first bank layer 172 is formed in an area other than the emission regions 200 of the sub-pixels 50R, 50G and 50B, and the first regions 210 are regions overlapping with the third via hole 153 of the sub-pixels 50R, 50G and 50B.

In addition, the second regions 220 are defined as regions other than the emission regions 200 of the sub-pixels 50R, 50G and 50B and the third via hole 153. The second regions 220 are also disposed between the plurality of sub-pixels 50R, 50G and 50B. For example, the second regions 220 can be disposed between sub-pixels emitting the same color light and between sub-pixels emitting light having different colors. The second regions 220 may also be regions other than the first regions 210.

The third embodiment differs from the above-described first and second embodiments in that the first regions 210 are formed in a dot shape. Accordingly, the second regions 220 are formed in a mesh shape. Further, the first regions 210 are separately disposed having the second region 220 therebetween. For example, the first regions 210 can be formed in a dot shape. Further, the second regions 220 overlap with the second bank layer 176 and the first regions do not overlap with the second bank layer 176.

In addition, the first regions 210 of the first bank layer 172 overlap with at least on the third via holes 153 through which the first electrode 160 is connected to the drain electrode. Specifically, referring to FIG. 17, the first regions 210 of the first bank layer 172 overlap with the third via hole 153 and has a first thickness T1 such that they completely cover the third via hole 153. Since the third via hole 153 has a high stepped portion, the first regions 210 can mitigate the stepped portion of the third via hole 153 when the first regions 210 overlapping with the third via hole 153 have a sufficient thickness T1. Accordingly, it is possible to prevent the first electrode 160 formed in the third via hole 153 from being exposed from the first bank layer 172 by forming the first regions 210 of the first bank layer 172 thick.

Further, the second regions 220 of the first bank layer 172 have a second thickness T2 less than the first thickness T1. The second regions 220 also overlap with the second bank layer 176, and an organic light emitting layer having an non-uniform thickness may be formed due to the thickness of the first bank layer 172. Accordingly, the second regions 220 of the first bank layer 172 may be formed as thin as possible.

When the second regions 220 of the first bank layer 172 are formed thin, a height difference between the first electrode 160 and the first bank layer 172 is reduced and thus the organic light emitting layer 175 can be formed to have a uniform thickness. That is, the organic light emitting layer 175 having a uniform thickness at the edges thereof in contact with the bank layer 170 and the center part thereof can be formed. Accordingly, a luminance deviation according to location can be reduced to improve display quality since the organic light emitting layer 175 having a uniform thickness is formed. Furthermore, a current density difference in the organic light emitting layer 175 can be reduced to prevent decrease in the lifespan of elements and generation of dark spots, improving process yield.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. An organic light-emitting display device comprising:
   a substrate on which a plurality of sub-pixels are arranged;
   a thin film transistor and a first electrode of an organic light-emitting diode connected to the thin film transistor, the thin film transistor and the organic light-emitting diode being disposed in each of the plurality of sub-pixels;
   a first bank layer disposed on the first electrode, exposing the first electrode and having hydrophilicity; and
   a second bank layer disposed on the first bank layer, exposing the first bank layer and the first electrode and having hydrophobicity,
   wherein the first bank layer includes first regions overlapping with via holes through which the thin film transistor is connected to the first electrode and second regions which are regions other than the first regions,
   wherein a thickness of the first regions is greater than a thickness of the second regions, and
   wherein the first regions and the second bank layer do not overlap, and the second regions comprise regions overlapping the second bank layer.
2. The organic light-emitting display device according to claim 1, wherein the second bank layer is disposed between sub-pixels emitting light having different colors among the plurality of sub-pixels.
3. The organic light-emitting display device according to claim 1, wherein the first regions are disposed between sub-pixels emitting a same color light among the plurality of sub-pixels.

4. The organic light-emitting display device according to claim 1, wherein the first regions and the second regions do not overlap.

5. The organic light-emitting display device according to claim 1, wherein the first regions extend in parallel with a direction in which shorter sides of the plurality of sub-pixels extend.

6. The organic light-emitting display device according to claim 1, wherein the second regions are separated having the first region interposed therebetween.

7. The organic light-emitting display device according to claim 1, wherein the second regions extend in parallel with a direction in which longer sides of the plurality of sub-pixels extend.

8. The organic light-emitting display device according to claim 7, wherein the second regions overlap with the second bank layer while being disposed in parallel with the second bank layer and are continuously disposed.

9. The organic light-emitting display device according to claim 8, wherein the first regions are separated having the second region interposed therebetween.

10. The organic light-emitting display device according to claim 1, wherein the second regions are disposed between sub-pixels emitting the same color and between sub-pixels emitting different colors among the plurality of sub-pixels.

11. The organic light-emitting display device according to claim 10, wherein the first regions do not overlap with the second bank layer.

12. The organic light-emitting display device according to claim 1, wherein the via holes include a first via hole of a passivation layer which exposes one of source and drain electrodes of the thin film transistor, and a second via hole of an overcoat layer which is disposed on the passivation layer and exposes the first via hole.

13. An organic light-emitting display device comprising:
a substrate on which a plurality of sub-pixels are arranged;
a first electrode of an organic light-emitting diode disposed in each of the plurality of sub-pixels;
a first bank layer disposed on the first electrode, exposing the first electrode and having hydrophilicity; and
a second bank layer disposed on the first bank layer, exposing the first bank layer and the first electrode and having hydrophobicity,
wherein the first bank layer includes first regions disposed between sub-pixels emitting a same color light among the plurality of sub-pixels and second regions that are regions other than the first regions,
wherein a thickness of the first regions is greater than a thickness of the second regions, and
wherein the first regions and the second bank layer do not overlap, and the second regions comprise regions overlapping the second bank layer.

14. The organic light-emitting display device according to claim 13, wherein the second bank layer is disposed between sub-pixels emitting light having different colors among the plurality of sub-pixels.

15. The organic light-emitting display device according to claim 13, wherein the first regions and the second regions do not overlap.

16. The organic light-emitting display device according to claim 13, wherein the first regions extend in parallel with a direction in which shorter sides of the plurality of sub-pixels extend.

* * * * *